United States Patent
Takasu

(10) Patent No.: US 6,586,282 B1
(45) Date of Patent: Jul. 1, 2003

(54) METHOD OF MANUFACTURING A SEMICONDUCTOR DEVICE

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/569,182

(22) Filed: May 11, 2000

(30) Foreign Application Priority Data

May 11, 1999 (JP) ............................................. 11-130049

(51) Int. Cl.[7] .......................... H01L 21/82; H01L 21/76; H01L 21/44
(52) U.S. Cl. ........................ 438/132; 438/131; 438/600; 438/601; 438/401; 438/462; 257/529; 257/530
(58) Field of Search .................................. 438/132, 131, 438/600, 601, 401, 462; 257/529, 530

(56) References Cited

U.S. PATENT DOCUMENTS

| | | | | |
|---|---|---|---|---|
| 5,538,924 A | * | 7/1996 | Chen .......................... | 438/132 |
| 5,567,643 A | * | 10/1996 | Lee et al. ..................... | 438/60 |
| 5,869,383 A | * | 2/1999 | Chien et al. ................. | 438/401 |
| 6,180,503 B1 | * | 1/2001 | Tzeng et al. ................. | 438/601 |
| 6,320,242 B1 | * | 11/2001 | Takasu et al. ............... | 257/529 |
| 6,372,554 B1 | * | 4/2002 | Kawakita et al. ........... | 438/132 |

* cited by examiner

*Primary Examiner*—John F. Niebling
*Assistant Examiner*—Jennifer M. Kennedy
(74) *Attorney, Agent, or Firm*—Adams & Wilks

(57) ABSTRACT

A method of manufacturing a semiconductor device comprises forming a thin film over a semiconductor substrate, patterning the thin film to define a portion of a laser trimming registration position pattern while simultaneously forming a fuse element formed from the same thin film and separate from the portion of the laser trimming position registration pattern, and forming a metallic film on the portion of the laser trimming position pattern but not on the fuse element.

32 Claims, 7 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device having a pattern for position registration for cutting a fuse element formed on a semiconductor chip surface by irradiating a laser beam with high accuracy.

2. Description of the Related Art

A laser trimming method for adjusting analog characteristics is known in a device of an analog semiconductor integrated circuit. For example, the laser trimming method is described in Japanese Laid-Open (Kokai) Patent No. 5-13670. In this method, after integrated circuits are two-dimensionally patterned in a semiconductor wafer, electric characteristics of each integrated circuit are measured in a wafer state. Next, a fuse element arranged in one portion of wiring is selected to adjust the analog characteristics and is cut by irradiating a laser beam. The analog characteristics of the integrated circuit can be conformed to desirable characteristics by selectively cutting the fuse element by such a laser trimming method. A pattern for position registration is arranged on a semiconductor wafer surface to irradiate the laser beam to a predetermined fuse element. FIG. 3A is a plan view of a conventional laser trimming position registration pattern. FIG. 3B is a cross-sectional view of the conventional laser trimming position registration pattern. FIG. 3C is a view showing a change in light reflecting amount when this pattern for laser trimming position registration is scanned along the direction of a line C–C' by the irradiation of the light beam. As shown in FIG. 3A, the conventional laser trimming position registration pattern is constructed by a so-called theta mark 301, an X-direction trimming mark 302 and a Y-direction trimming mark 303. The theta mark 301 is arranged on a scribe line 203 to perform a relative rough position registration operation with respect to a rotating direction of the semiconductor wafer. The X-direction trimming mark 302 and the Y-direction trimming mark 303 are arranged to perform an accurate position registration operation with respect to each of semiconductor integrated circuits 201 repeatedly arranged. The theta mark 301 is desirably formed in a characteristic shape different from that of a pad area 202, etc. within the semiconductor integrated circuits 201 so as to automatically recognize an image.

In an example of FIG. 3A, the shape of the theta mark 301 is of a key type, but may be set to another shape if this shape is a singular shape and is easily recognized.

As shown in FIG. 3B, in the conventional position registration pattern, a square aluminum film 105 is arranged on a first insulating film 102 constructed by a silicon oxide film arranged on a silicon substrate 101. When the light beam is scanned along the direction of the line C–C' of FIG. 3A, a light reflecting pattern is obtained as shown in FIG. 3C since reflectivity of the aluminum film 105 is high. A position relation between the position registration pattern and the fuse element constructed by a polycrystal silicon film of the integrated circuit is determined at a designing time. Accordingly, the coordinates of a desirable fuse element are calculated by detecting the position registration pattern by the irradiation of the light beam, and the fuse element can be selectively trimmed by irradiating the laser beam to this coordinate place.

However, in the conventional laser trimming, no accurate position registration operation can be performed since the fuse element and the position registration pattern are formed by different thin films. Namely, when the pattern for position registration is detected by a pattern of aluminum and the polycrystal silicon film as the fuse element is laser-trimmed, the position of a laser irradiating area 32 is shifted from the fuse element 31 as shown in FIG. 4. Since an energy distribution of the laser irradiating area 32 is set to a Gaussian distribution, energy intensity in a laser irradiating end portion is low. Accordingly, when there is a large shift in alignment between patterning of the polycrystal silicon film and patterning of the aluminum film in a wafer process, a problem exists in that no fuse element can be stably cut. Reference numerals 33 and 34 respectively designate a burning portion of a foundation and a portion left in the fuse cut.

SUMMARY OF THE INVENTION

Therefore, an object of the present invention is to provide a method of manufacturing a semiconductor device capable of precisely performing position registration and trimming operations with respect to a fuse element of a semiconductor chip without increasing the number of normal semiconductor integrated circuit manufacturing processes. Another object of the present invention is to make a fuse element area compact and reduce cost by improving a position registration accuracy of trimming.

To solve the above-mentioned problems, the present invention uses the following means.

(1) A semiconductor device is constructed by semiconductor integrated circuits repeatedly arranged two-dimensionally in a matrix shape on the surface of a semiconductor wafer through scribe lines, a fuse element for laser trimming arranged in the semiconductor integrated circuits, and a pattern for laser trimming position registration arranged on the surface of the semiconductor wafer. The pattern for laser trimming position registration is constructed by a high light reflectivity area and a low light reflectivity area. The high light reflectivity area is formed by a high light reflectivity film formed on a flat foundation. The low light reflectivity area is formed by a high light reflectivity film constructed by the same thin film as the fuse element for laser trimming and formed on the pattern of a grid, stripe or dot shape for causing irregular reflection of light.

(2) In the semiconductor device described in the item (1), the pattern for laser trimming position registration is constructed by the high light reflectivity area and the low light reflectivity area surrounded by the high light reflectivity area.

(3) In the semiconductor device describe in the item (1), the pattern for laser trimming position registration is constructed by the low light reflectivity area and the high light reflectivity area surrounded by the low light reflectivity area.

(4) In the semiconductor device described in the item (1), the fuse element for laser trimming is constructed by a polycrystal silicon thin film.

(5) In the semiconductor device described in the item (1), the high light reflectivity film is constructed by aluminum.

The present invention provides a manufacturing method capable of manufacturing the semiconductor device described in the above items (1) to (5) without increasing the number of normal manufacturing processes of the semiconductor integrated circuits.

DETAILED DESCRIPTION OF THE PREFERRED EMBODIMENTS

A semiconductor device having the following features can be manufactured without increasing the number of normal manufacturing processes of semiconductor integrated circuits.

A pattern for laser trimming position registration is constructed by a high light reflectivity area and a low light reflectivity area. The high light reflectivity area is formed by a high light reflectivity film formed on a flat foundation. The low light reflectivity area is formed by the high light reflectivity film constructed by the same thin film as a fuse element for laser trimming and formed on the pattern of a grid, stripe or dot shape for causing irregular reflection of light. Accordingly, the boundary of the high light reflectivity area and the low light reflectivity area, i.e., a place sharply changed in light reflectivity is prescribed by a pattern formed by the same thin film as the fuse element for laser trimming. Thus, the laser trimming can be accurately performed without having any influence on a shift in alignment in a wafer process.

The embodiments of the present invention will next be explained. In the following explanation, a fuse element for laser trimming is formed by a polycrystal silicon thin film so far as no fuse element is particularly said.

Figure 1A:
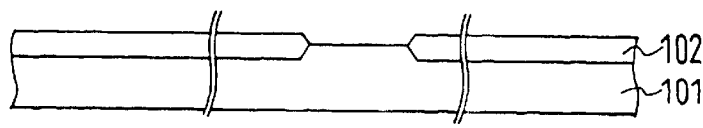
FIGS. 1A to 1F are typical sectional views showing a manufacturing method of a semiconductor device of the present invention.
Figure 1B:
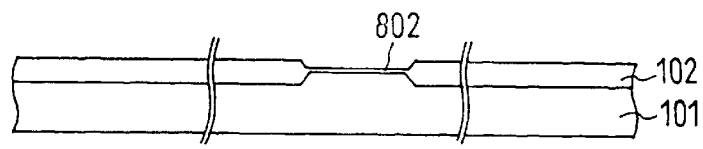
Figure 1C:
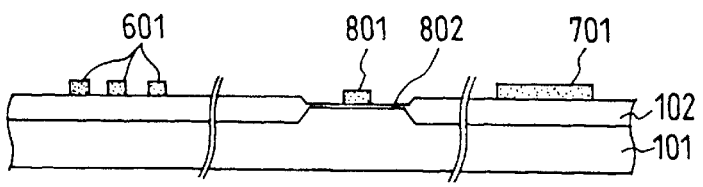

FIGS. 1A to 1F are typical sectional views showing a manufacturing method of a semiconductor device of the present invention. First, as shown in FIG. 1A, a first insulating film 102 generally called a field oxide film is selectively formed on a silicon substrate 101. A well area and a channel stop area may be formed before the formation of the first insulating film 102 in accordance with necessity although these areas are not illustrated for brevity. Next, as shown in FIG. 1B, a gate oxide film 802 is formed in a MOS type transistor area 810. Impurities for controlling a threshold value are implanted by an ion implantation method in accordance with necessity before or after the gate oxide film 802 is formed. Thereafter, a polycrystal silicon thin film 103 is formed and desirable impurities are implanted. Thereafter, as shown in FIG. 1C, etching removal is performed by leaving a required portion. At this time, a polycrystal silicon dot 601 is formed in a portion that becomes later a pattern 204 for laser trimming position registration. In the polycrystal silicon dot 601, the polycrystal silicon thin film 103 is processed in a dot shape. A polycrystal silicon fuse 701 is formed in a portion that becomes later a fuse element 31. Further, a gate electrode 801 manufactured by the polycrystal silicon thin film 103 is formed in a MOS type transistor area 810.

As mentioned above, one feature of the present invention resides in that the polycrystal silicon dot 601, the polycrystal silicon fuse 701, and the gate electrode 801 in the MOS type transistor are simultaneously formed by the same polycrystal silicon thin film 103. In particular, the polycrystal silicon dot 601 within the pattern 204 for laser trimming position registration and the polycrystal silicon fuse 701 as a portion set to the fuse element 31 are formed in the same photomask process so that the polycrystal silicon dot 601 and the polycrystal silicon fuse 701 are mutually set to a position relation of self alignment. Accordingly, when the polycrystal silicon fuse 701 as a portion set to the fuse element 31 is positioned by the pattern 204 for laser trimming position registration in the present invention and a laser beam is irradiated to this polycrystal silicon fuse 701, the laser beam can be exactly irradiated to the polycrystal silicon fuse 701 so that no position shift is caused.

Figure 1D:
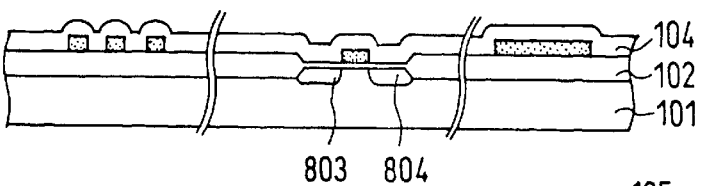
Figures 1E, 1F:
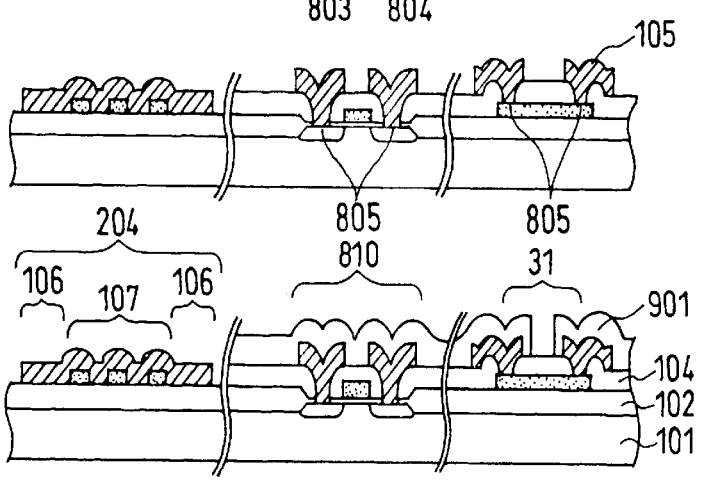

Next, as shown in FIG. 1D, a source area 803 and a drain area 804 are formed in the MOS type transistor area 810 by the ion implantation method, for example. Thereafter, a second insulating film 104 constructed by an NSG film, a PSG film or a BPSG film, etc. is formed. Next, as shown in FIG. 1E, a predetermined portion of the second insulating film 104 is removed by etching. At this time, the second insulating film 104 is removed from a portion set to the pattern 204 for laser trimming position registration. Further, only a contact area 805 is opened in portions set to the MOS type transistor area 801 and the fuse element 31. Thereafter, an aluminum film 105 is formed by a sputtering method, etc., and the portions set to the MOS type transistor area 810 and the fuse element 31 are then etched and removed by leaving a desirable portion for wiring, etc. In contrast to this, the aluminum film 105 is left in the portion set to the pattern 204 for laser trimming position registration.

Next, as shown in FIG. 1F, after a protective film 901, such as a silicon nitride film, is formed on an entire surface, etching removal is performed by leaving a desirable area. At this time, the protective film 901 is left in the MOS type transistor 810 and only an irradiating area of the laser beam is opened in a portion set to the fuse element 31, and the protective film 901 is left so as to cover the remaining portion. The protective film 901 is removed from a portion set to the pattern 204 for laser trimming position registration.

Thus, the MOS type transistor area 810, the fuse element 31 having the polycrystal silicon fuse 701, and the pattern 204 for laser trimming position registration having a low light reflectivity area 107 surrounded by a high light reflectivity area 106 are completed.

In the explanation of the above embodiment, the first insulating film 102 is also formed in the portion set to the pattern 204 for laser trimming position registration in FIG. 1A, but the first insulating. film 102 is not necessarily formed. Accordingly, no first insulating film 102 may be formed in accordance with cases. Further, in FIG. 1E, the second insulating film 104 is removed from the portion set to the pattern 204 for laser trimming position registration. However, the second insulating film 104 is not removed, but may be left when a problem exists in that the first insulating film 102 is also removed in the removal of the second insulating film 104 and a shape of the polycrystal silicon dot 601 is broken by a problem of process ability, etc.

In FIG. 1F, the protective film 901 is removed from the portion set to the pattern 204 for laser trimming position registration. However, the protective film 901 may be intentionally left to further increase irregular reflection in the low light reflectivity area 107. At this time, it is conditionally necessary to set the protective film 901 to an insulating film that can transmit light and does not reduce light reflectivity of the high light reflectivity area 106.

In the above example, the polycrystal silicon dot 601 is formed by processing the polycrystal silicon thin film 103 in a dot shape within the pattern 204 for laser trimming position registration. However, a pattern processed in a stripe or grid shape may be also used instead of the dot shape in the polycrystal silicon thin film 103.

A semiconductor device formed by the manufacturing method in the above embodiment will next be explained.

Figure 2A:
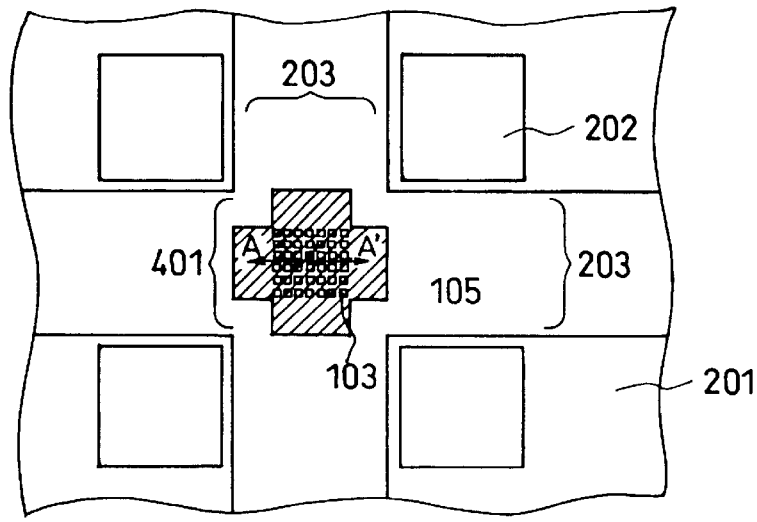
FIG. 2A is a plan view of a pattern for position registration in a first embodiment of the semiconductor device of the present invention.
Figure 2B:
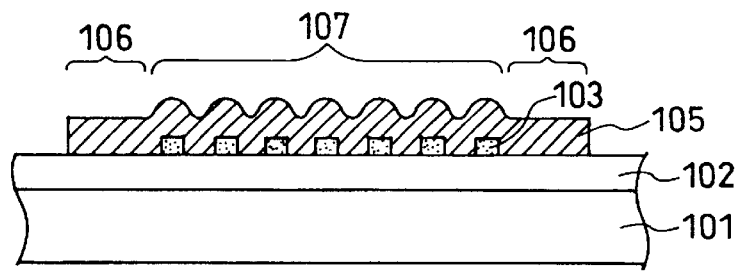
FIG. 2B is a cross-sectional view of the pattern for position registration in the first embodiment of the semiconductor device of the present invention.
Figure 2C:
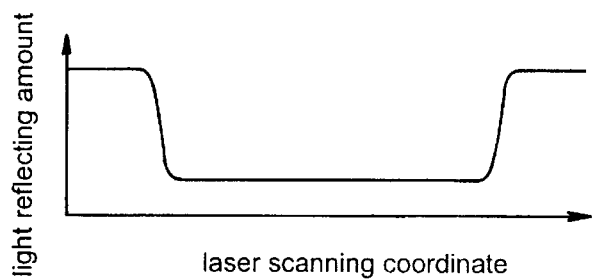
FIG. 2C is a view showing a light reflecting amount taken along the line of A–A' of FIG. 1A.

FIG. 2A is a plan view of the pattern for laser trimming position registration in a first embodiment formed by the manufacturing method in the above embodiment. FIG. 2B is a cross-sectional view of the pattern for laser trimming position registration in the first embodiment of the semiconductor device of the present invention. FIG. 2C is a view showing a change in light reflecting amount when a light beam is scanned to the pattern for laser trimming position registration in the first embodiment of the semiconductor device of the present invention. The light reflecting amount shows a value provided when the light beam is scanned along the direction of a line A–A' of FIG. 2A. As shown in FIG. 1A, the pattern 401 for laser trimming position registration in the embodiment of the present invention is arranged at an intersecting point of scribe lines 203. The pattern 401 for laser trimming position registration has a continuous structure having the function of a so-called theta mark for performing a relatively rough position-aligning operation with respect to the rotating direction of a semiconductor wafer, and the functions of an X-direction trimming mark and a Y-direction trimming mark for performing an accurate position-aligning operation with respect to each of semiconductor integrated circuits 201 repeatedly arranged. A shape of the pattern 401 for laser trimming position registration is desirably set to a characteristic shape different from that of a pad area 202, etc. within the semiconductor integrated circuits 201 so as to automatically recognize an image. Therefore, the shape of the pattern 401 for laser trimming position registration is set to a cross shape in the example of FIG. 2A.

A sectional structure of the pattern 401 for laser trimming position registration in the embodiment of the present invention will next be explained by using FIG. 2B.

A first insulating film 102 constructed by a silicon oxide film, etc. is formed on a silicon substrate 101. A polycrystal silicon dot 601 is formed on the first insulating film 102. The flat first insulating film 102 is exposed to a nonforming area of the polycrystal silicon dot 601. An aluminum film 105 is formed on this flat first insulating film 102. A surface of the aluminum film 105 located on a forming area of the polycrystal silicon dot 601 is set to be irregular by the influence of a pattern of the polycrystal silicon dot 601, and light irradiated to this irregular portion is irregularly reflected. Accordingly, this area can be set to a low light reflectivity area 107. In contrast to this, the surface of the aluminum 105 on the nonforming area of the polycrystal silicon dot 601 is flat and can be set to a high light reflectivity area 106.

As shown in FIG. 2c, when the light beam is scanned along the direction of a line A–A' in FIG. 2A, a light reflecting amount is large in the high light reflectivity area 106 formed by the aluminum film 105 having the flat surface, and is small in the low light reflectivity area 107 formed by the aluminum film 105 having the irregular surface.

In the examples of FIGS. 2A, 2B and 2C, the low light reflectivity area 107 is formed by utilizing an irregular reflecting action of light. The pattern of the polycrystal silicon dot 601 is formed by the polycrystal silicon thin film 103 as the same thin film as a fuse element to cause the irregular reflection of light. Light can be also irregularly reflected by a pattern such as a grid or stripe shape in addition to the dot shape, and a light reflecting pattern as shown in FIG. 2C is obtained.

As described above, the first insulating film 102, the second insulating film, etc. in FIG. 2B may be also formed in accordance with cases. Further, a metallic material such as tungsten, chromium, and gold as the high light reflectivity film may be also used instead of the aluminum film 105.

As mentioned above, the boundary of the high light reflectivity area 106 and the low light reflectivity area 107 is determined by the pattern of the polycrystal silicon dot 601 formed by the polycrystal silicon thin film 103 as the same thin film material as the fuse element. Therefore, it is possible to solve a conventional problem of a position registration pattern in which the polycrystal silicon forming the fuse element and the aluminum film forming the position registration pattern are not aligned with each other, but are shifted from each other.

Further, the pattern 204 for laser trimming position registration is arranged at the intersecting point of the scribe lines 203. The pattern 204 for laser trimming position registration has the continuous structure able to have the function of the so-called theta mark for performing the relatively rough position-aligning operation with respect to the rotating direction of the semiconductor wafer, and the functions of the trimming marks for performing the accurate position-aligning operation in X and Y directions with respect to each of the semiconductor integrated circuits repeatedly arranged. Accordingly, it is possible to reduce an area of the pattern for laser trimming position registration occupied in a scribe line area.

Figure 5A:
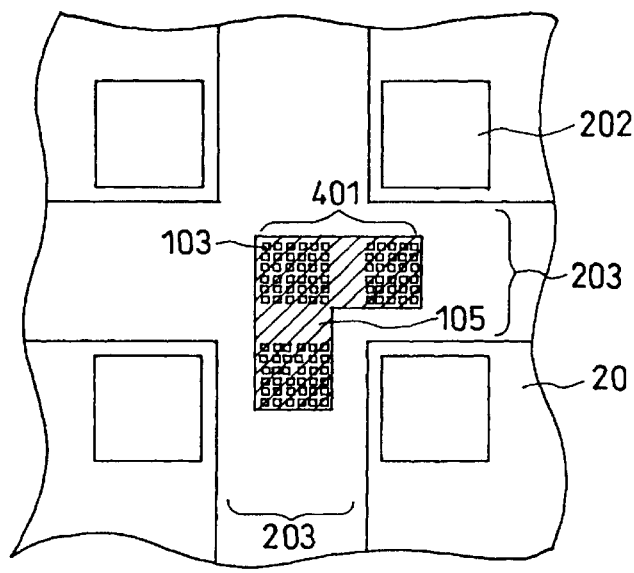
FIG. 5A is a plan view of a pattern for position registration in a second embodiment of the semiconductor device of the present invention.
Figure 5B:
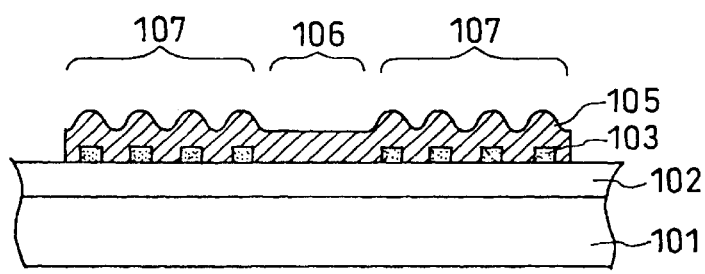
FIG. 5B is a cross-sectional view of the pattern for position registration in the second embodiment of the semiconductor device of the present invention.
Figure 5C:
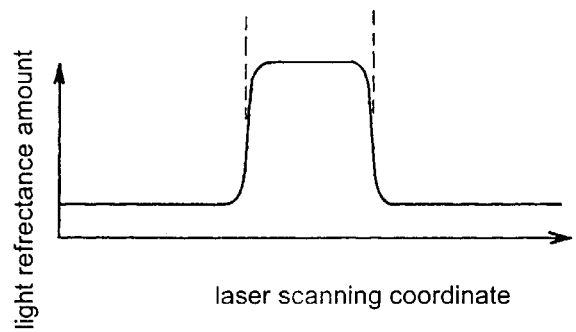
FIG. 5C is a view showing a light reflecting amount taken along the line of B–B' of FIG. 3A.

FIG. 5A is a plan view of a pattern for laser trimming position registration in a second embodiment of the manufacturing method of the semiconductor device of the present invention. FIG. 5B is a cross-sectional view of the pattern for position registration in the second embodiment of the semiconductor device of the present invention. FIG. 5C is a view showing a change in light reflecting amount when a light beam is scanned to the pattern for position registration in the second embodiment of the semiconductor device of the present invention The light reflecting amount shows a value provided when the light beam is scanned along the direction of a line B–B' of FIG. 5A.

Similar to the first embodiment shown in FIGS. 2A to 2C, the pattern 204 for laser trimming position registration in the second embodiment of the present invention is arranged at an intersecting point of scribe lines 203.

The second embodiment differs from the first embodiment in that a high light reflectivity area 106 is interposed between low light reflectivity areas 107 and a shape of the laser trimming position registration pattern 204 is of a key type although this shape is of a cross type in the example of FIG. 2.

Figure 3A:
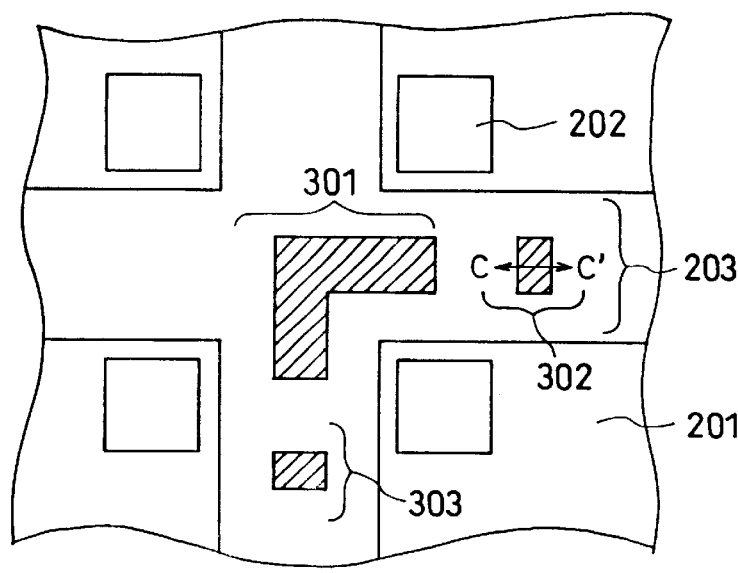
FIG. 3A is a plan view of a pattern for position registration in a conventional semiconductor device.
Figure 3B:
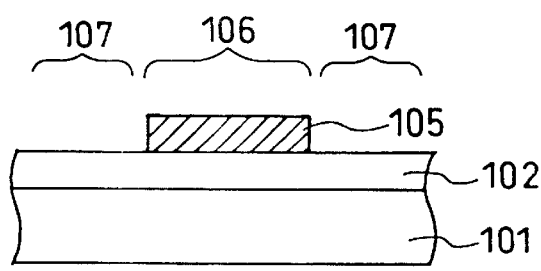
FIG. 3B is a cross-sectional view of the pattern for position registration in the conventional semiconductor device.
Figure 3C:
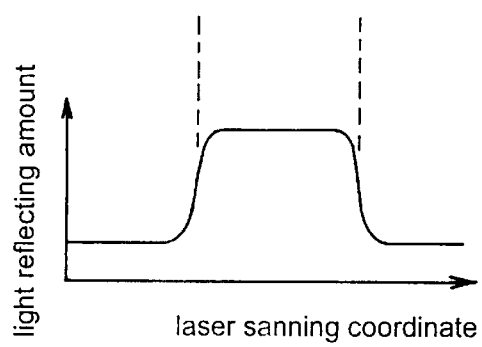
FIG. 3C is a view showing a light reflecting amount taken along the line of C–C' of FIG. 2A.
Figure 4:
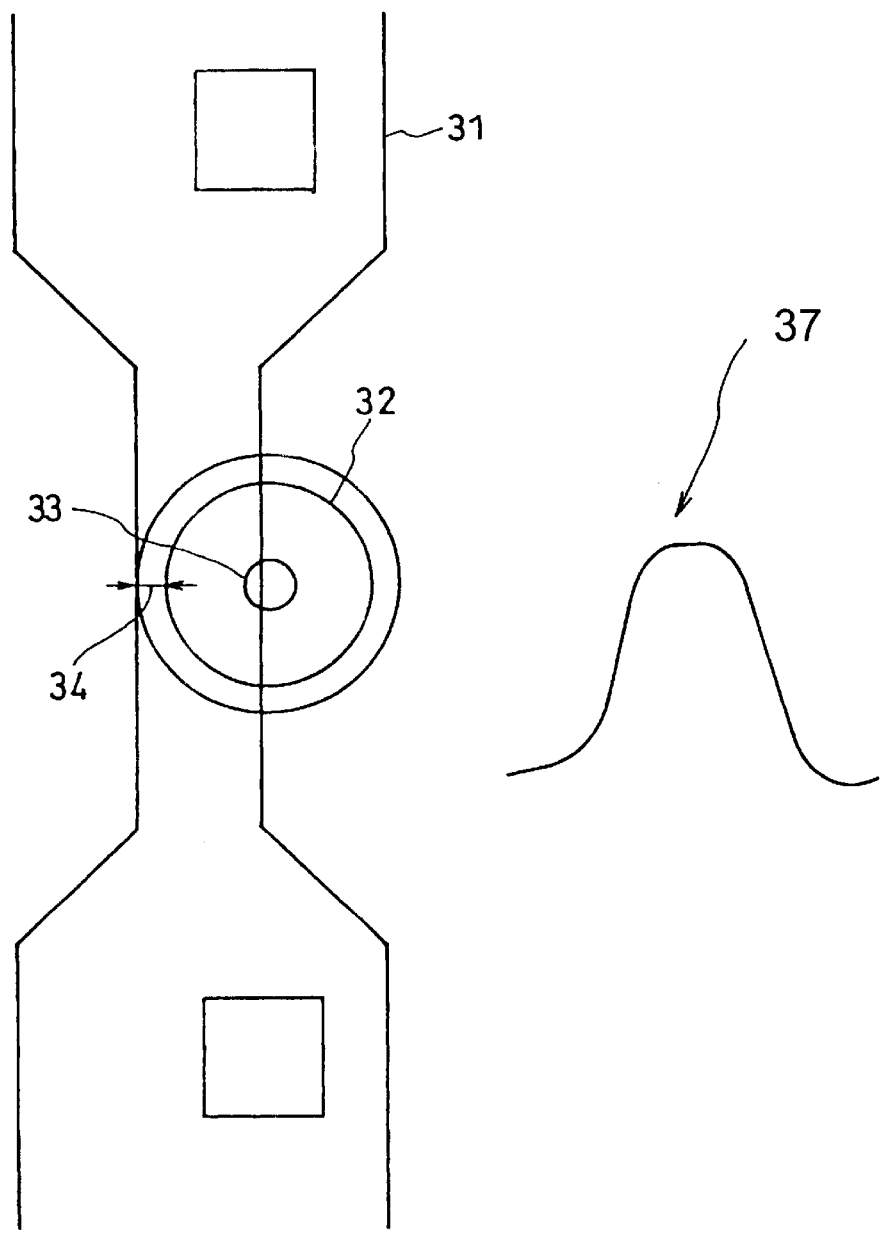
FIG. 4 is a plan view of a fuse element of a conventional semiconductor device.

It is sufficient to form the pattern for laser trimming position registration in a shape in which one of the high light reflectivity area 106 and the low light reflectivity area 107 is interposed between the other reflectivity areas. The second embodiment shown in FIGS. 5A to 5C shows the case of an arrangement opposed to that of the first embodiment shown in FIGS. 2A to 2C. Such a construction may be also used in the second embodiment. The shape of the pattern 204 for laser trimming position registration may be set to a characteristic shape different from that of a pad area 202, etc. within semiconductor integrated circuits 201 so as to automatically recognize an image. In the example of FIG. 5A, the shape of this pattern 204 for laser trimming position registration is set to be of a key type, but is not limited to shapes shown in FIGS. 2A and 3A.

The other explanations are omitted here by additionally describing the same reference numerals as FIGS. 2A to 2C.

Figure 6:
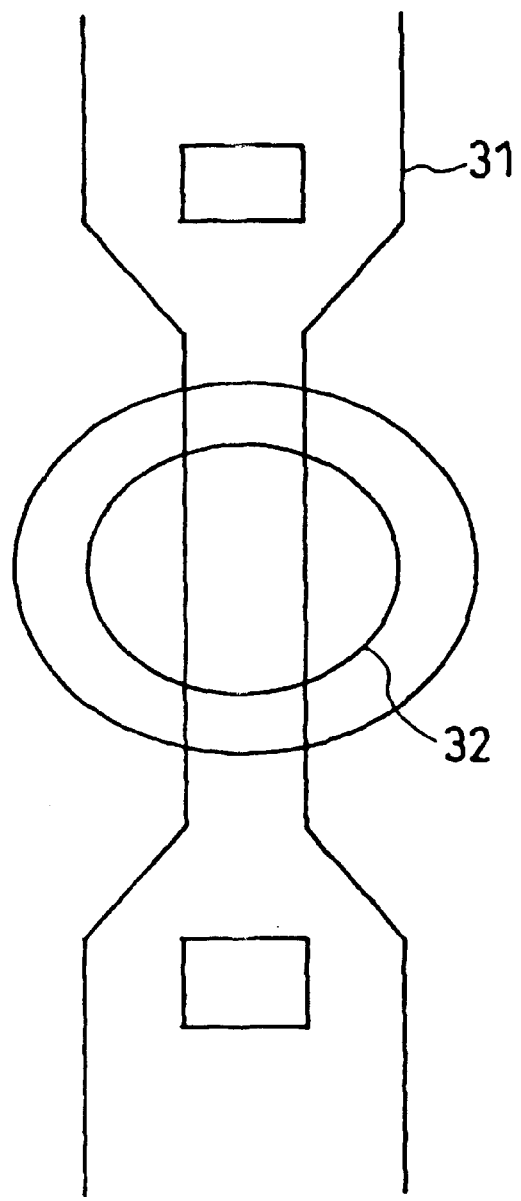
FIG. 6 is a plan view of a fuse element of the semiconductor device of the present invention.

FIG. 6 is a plan view of a fuse element trimmed by a laser beam by using the pattern for position registration in the semiconductor device of the present invention. A laser spot 32 can be irradiated with the fuse element 31 as a center.

Figure 7:
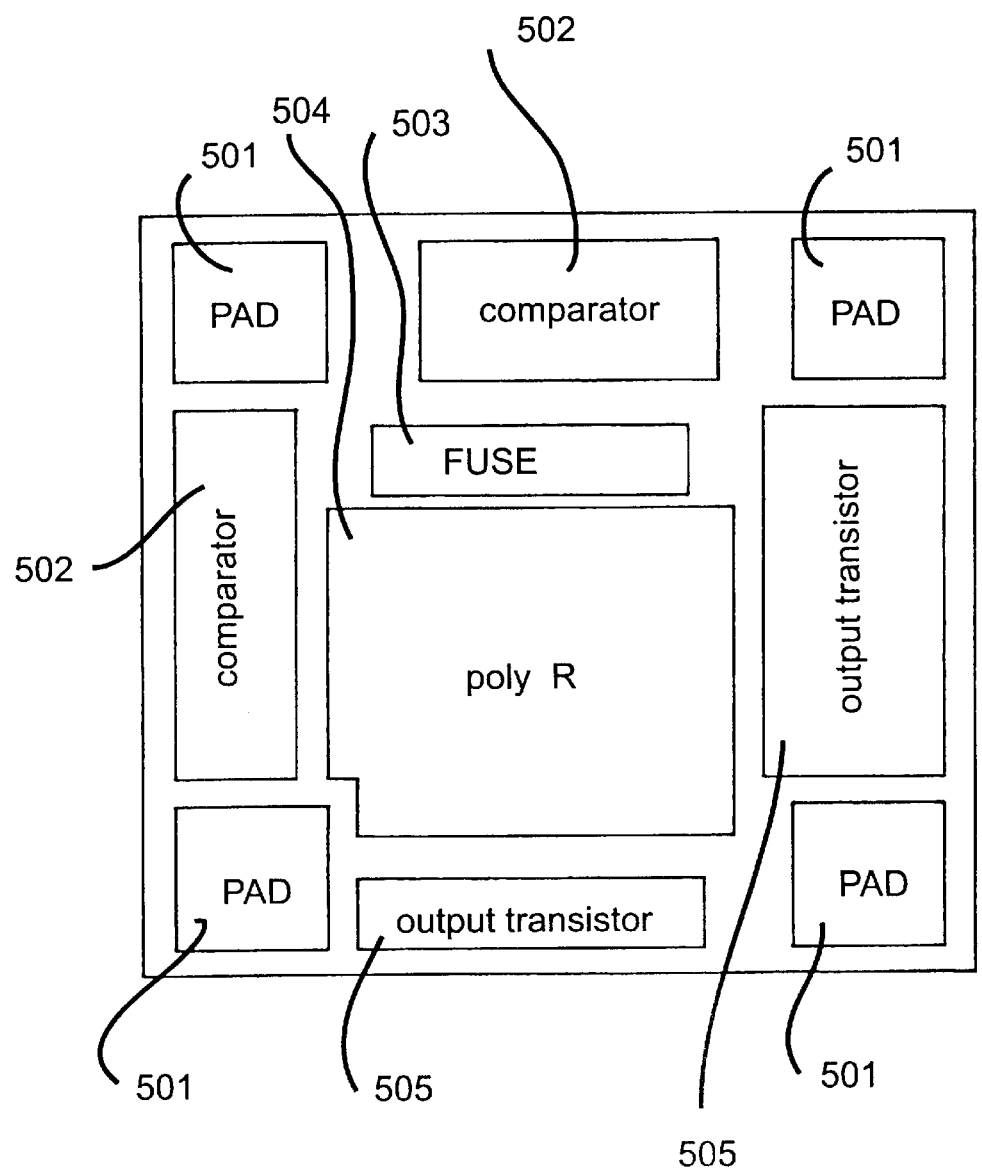
FIG. 7 is a plane view of the semiconductor device of the present invention.

The semiconductor device of the present invention is very suitable for a semiconductor integrated circuit constructed by a semiconductor element large in dispersion. For example, FIG. 7 is a plane view of an IC chip for detecting a voltage and constructed by a MOS transistor having a high withstand voltage. The integrated circuit comprises four PADs 501, two comparators 502, a FUSE 503, poly silicon Resistor 504 and two output transistors 505. The PADs 501 comprise a pad for input power supply Vdd, for ground Vss, for output Vout, and for test PAD for reference voltage Vref each other. A bleeder resistor or the poly silicon resisitor 504 divide an input voltage. Then the comparator 502 compare the input voltage a with a reference voltage, which generated by reference voltage generate circuit. If the input voltage becomes a predetermined detection voltage then invert an output of the comparator 502 and finally the output voltage, which is detected at the PAD 501 for the output, change high to low or low to high.

Then the FUSE 503 is cut by laser to correct a fluctuation of reference voltage of each chip to obtain a predetermined detection voltage. Further the FUSE 503 is cut to change connection of the bleeder resistor to obtain many detection voltages. The FUSE 503 is cut and a length of the poly silicon resistor 504 is change. Then the resistance value of the poly silicon resistor 504 is adjusted to change a divide ratio. The detected signal is output to final stage output transistor 505

The dispersion of a MOSIC in analog characteristics is large in comparison with a bipolar IC. In particular, in the case of high withstand voltage characteristics, the dispersion of the analog characteristics is further increased to increase the thickness of a gate insulating film. Accordingly, in the case of the analog MOSIC, a large fuse area is required as shown in FIG. 7. Analog characteristics having small dispersion can be obtained by arranging ten fuse elements or more.

Each of the fuse elements can be reduced in size by using the pattern for position registration in the present invention. Further, the fuse elements can be also arranged in two places or more by setting planar directions of the fuse elements to be different from each other.

The present invention is suitable for the analog MOSIC, but can be also used in a digital IC. Further, the present invention is also suitable for the realization of an analog bipolar IC of high density very small in dispersion.

In the embodiments shown in FIGS. 1, 2 and 5, the fuse element for laser trimming is formed by a polycrystal silicon thin film. However, the present invention is not limited to the polycrystal silicon thin film. It is sufficient to form the low light reflectivity area 107 by arranging a pattern of a dot shape, a stripe shape, or a grid shape, etc. for causing irregular reflection of light below a high light reflectivity film such as the aluminum film 105 by using the same thin film as a thin film forming the fuse element for laser trimming.

The first insulating film 102 is not necessarily required in FIGS. 1, 2 and 5. Accordingly, the first insulating film 102 may be also removed. Further, a metallic material such as tungsten, chromium, and gold as the high light reflectivity film may be also used instead of the aluminum film 105.

The manufacturing method of a pattern for laser trimming position registration in the present invention can form the pattern for laser trimming position registration in which the boundary of a high light reflectivity area and a low light reflectivity area, i.e., a place sharply changed in light reflectivity can be prescribed by a pattern formed by the same thin film as a fuse element for laser trimming without increasing the number of normal manufacturing processes of a semiconductor integrated circuit. Thus, the following effects are obtained.

(1) A fuse element can be stably cut.

(2) A fuse element area can be formed in a small area in an IC requiring plural fuse elements.

(3) The fuse element area can be designed by setting its directions to be different from each other in two places or more in the IC requiring plural fuse elements.

The pattern for laser trimming position registration in the present invention is also arranged at an intersecting point of scribe lines. This pattern for laser trimming position registration further has a continuous structure able to have both the function of a so-called theta mark for performing a relatively rough position-aligning operation with respect to the rotating direction of a semiconductor wafer, and the function of a trimming mark for performing an accurate position-aligning operation with respect to each of semiconductor integrated circuits repeatedly arranged. Accordingly, it is possible to reduce an area of the pattern for laser trimming position registration occupied on the scribe lines. Thus, the following effects are obtained.

(4) No cutting edge for dicing is easily damaged in cut-out (dicing process) of the semiconductor integrated circuits so that throughput is improved. Further, danger of damage of the semiconductor integrated circuits is also reduced.

(5) An area capable of inserting a pattern for test, a mark for pattern alignment, etc. used in a forming process (a so-called preprocess) of the semiconductor integrated circuits is widened so that sufficient schedule control can be performed.

What is claimed is:

1. A method of manufacturing a semiconductor device, comprising the steps of:

forming a first insulating film on a silicon substrate;

forming a gate oxide film in a MOS type transistor area;

simultaneously forming by one patterning process a dot pattern obtained by processing a thin film in a dot shape in a portion that becomes later a pattern for laser trimming position registration, a polycrystal silicon fuse in a portion that becomes later a fuse element, and a gate electrode formed from said thin film in said MOS type transistor area;

forming a second insulating film from an NSG film, a PSG film or a BPSG film after a source area and a drain area are formed in said MOS type transistor area and said pattern portion for laser trimming position registration;

removing said second insulating film from said pattern portion for laser trimming position registration and opening only a contact area in said MOS type transistor area and said fuse element portion;

forming a metallic film in said MOS type transistor area, said fuse element portion, and said pattern portion for laser trimming position registration;

etching the metallic film to remove the metallic film from the fuse element portion while leaving a given portion of the metallic film for wiring in said MOS type transistor area and while leaving the metallic film in said pattern portion for laser trimming position registration;

forming a protective film over the MOS type transistor area, the fuse element portion and the pattern portion for laser trimming position registration; and patterning the protective film so that the protective film is left in said MOS type transistor area, only an area for irradiating a laser beam is opened in said fuse element portion, and said protective film is removed from said pattern portion for laser trimming position registration.

2. A method of manufacturing a semiconductor device according to claim 1; including the step of forming a polycrystal silicon stripe in said pattern portion for laser trimming position registration by processing said thin film in a shape of plural stripes.

3. A method of manufacturing a semiconductor device according to claim 1; including the step of forming a polycrystal silicon grid in said pattern portion for laser trimming position registration by processing said thin film in a grid shape.

4. A method of manufacturing a semiconductor device according to claim 1; further comprising the step of forming the pattern for laser trimming position registration by forming a high light reflectivity area and a low light reflectivity area surrounded by the high light reflectivity area.

5. A method of manufacturing a semiconductor device according to claim 1; further comprising the step of forming the pattern for laser trimming position registration by forming a low light reflectivity area and a high light reflectivity area surrounded by said low light reflectivity area.

6. A method of manufacturing a semiconductor device according to claim 1; the thin film comprises a silicide thin film.

7. A method of manufacturing a semiconductor device according to claim 1; wherein the metallic film comprises a high melting metallic film.

8. A method according to claim 1; wherein the thin film is a polycrystal silicon film.

9. A method according to claim 1; wherein the metallic film is aluminum.

10. A method according to claim 1; wherein the step of forming the second insulating film comprises forming the second insulating film by ion implantation.

11. A method according to claim 2; wherein the thin film is a polycrystal silicon film.

12. A method according to claim 3; wherein the thin film is a polycrystal silicon film.

13. A method of manufacturing a semiconductor device to facilitate trimming a fuse element arranged relative to a laser trimming position registration pattern, comprising the steps of: forming a thin film over a semiconductor substrate; patterning the thin film to define a portion of a laser trimming position registration pattern while simultaneously forming a fuse element from the same thin film and separate from the portion of the laser trimming position registration pattern; and forming a metallic film on the portion of. the laser trimming position pattern but not on the fuse element.

14. A method according to claim 13; wherein the thin film is a polycrystal silicon film.

15. A method according to claim 13; wherein the thin film is a silicide thin film.

16. A method according to claim 13; wherein the laser trimming position registration pattern comprises at least one of a grid, stripe and dot shapes of the thin film selectively arranged to define a high light reflectivity area and a low light reflectivity area.

17. A method according to claim 16; further comprising forming a metallic film corresponding to an upper layer of the high reflectivity and low reflectivity areas; and wherein the high reflectivity area corresponds to substantially flat portions and the low reflectivity area corresponds to uneven non-flat portions.

18. A method according to claim 17; wherein the metallic film is aluminum.

19. A method according to claim 17; wherein the metallic film is comprised of a metallic material selected from the group consisting of aluminum, tungsten, chromium, and gold.

20. A method according to claim 17; wherein the laser trimming position registration pattern is generally cross-shaped.

21. A method according to claim 16; wherein the laser trimming position registration pattern is generally cross-shaped.

22. A method according to claim 21; wherein the thin film is a polycrystal silicon film.

23. A method according to claim 21; wherein the thin film is a silicide thin film.

24. A method according to claim 16; further comprising the steps of identifying scribe line boundaries on the semiconductor device; and forming the laser trimming position registration pattern at an intersecting point between the scribe line boundaries.

25. A method of manufacturing a semiconductor device to facilitate trimming a fuse element arranged relative to a laser trimming position registration pattern, comprising the steps of: forming a thin film over a semiconductor substrate; patterning the thin film to define a portion of a laser trimming position registration pattern comprised of at least one of a grid, stripe and dot shape of the thin film and selectively arranged to define a high light reflectivity area and a low light reflectivity area; simultaneously forming a fuse element from the thin film while patterning the thin film; forming a gate oxide film of a MOS type transistor; and forming a gate electrode of the MOS type transistor from the thin film.

26. A method according to claim 25; wherein the fuse element, the gate electrode and the portion of the laser trimming position registration pattern are all formed simultaneously using a single photomask.

27. A method according to claim 26; further comprising forming a first insulating film over the semiconductor substrate before forming the thin film.

28. A method according to claim 27; further comprising forming a second insulating film over the laser trimming position registration pattern, and removing a portion of the second insulating film disposed over the laser trimming position registration pattern.

29. A method according to claim 28; wherein the thin film is a polycrystal silicon film.

30. A method according to claim 28; wherein the thin film is a silicide thin film.

31. A method according to claim 27; wherein the thin film is a polycrystal silicon film.

32. A method according to claim 27; wherein the thin film is a silicide thin film.

* * * * *